US010295899B2

(12) United States Patent
Lee et al.

(10) Patent No.: US 10,295,899 B2
(45) Date of Patent: May 21, 2019

(54) PHOTOMASK INCLUDING FIDUCIAL MARK, METHOD OF PATTERNING THE PHOTOMASK AND METHOD OF MAKING SEMICONDUCTOR DEVICE USING THE PHOTOMASK

(71) Applicant: TAIWAN SEMICONDUCTOR MANUFACTURING COMPANY, LTD., Hsinchu (TW)

(72) Inventors: Hsin-Chang Lee, Zhubei (TW); Chia-Jen Chen, Jhudong Township (TW); Chih-Cheng Lin, Kaohsiung (TW); Ping-Hsun Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 99 days.

(21) Appl. No.: 15/626,643

(22) Filed: Jun. 19, 2017

(65) Prior Publication Data

US 2018/0364560 A1 Dec. 20, 2018

(51) Int. Cl.

| | |
|---|---|
| ***G03F 1/22*** | (2012.01) |
| ***G03F 1/44*** | (2012.01) |
| ***G03F 1/54*** | (2012.01) |
| ***G03F 1/72*** | (2012.01) |
| ***G03F 1/76*** | (2012.01) |
| ***G03F 1/78*** | (2012.01) |
| ***G03F 1/84*** | (2012.01) |
| ***G03F 7/20*** | (2006.01) |
| ***H01L 21/027*** | (2006.01) |

(52) U.S. Cl.

CPC .................. *G03F 1/44* (2013.01); *G03F 1/22* (2013.01); *G03F 1/54* (2013.01); *G03F 1/72* (2013.01); *G03F 1/76* (2013.01); *G03F 1/78* (2013.01); *G03F 1/84* (2013.01); *G03F 7/2004* (2013.01); *H01L 21/0274* (2013.01)

(58) Field of Classification Search

CPC ..... G03F 1/22; G03F 1/44; G03F 1/54; G03F 1/72; G03F 1/76; G03F 1/78; G03F 1/84; G03F 7/2004; H01L 21/0274

USPC ....................................... 430/5, 30, 296, 942

See application file for complete search history.

(56) References Cited

U.S. PATENT DOCUMENTS

| | | | |
|---|---|---|---|
| 7,260,442 | B2 | 8/2007 | Hwang et al. |
| 9,256,709 | B2 | 2/2016 | Yu et al. |
| 2011/0161893 | A1 | 6/2011 | Lin et al. |
| 2013/0337370 | A1 | 12/2013 | Lee et al. |
| 2014/0040838 | A1 | 2/2014 | Liu et al. |
| 2015/0278429 | A1 | 10/2015 | Chang |

*Primary Examiner* — Christopher G Young

(74) *Attorney, Agent, or Firm* — Hauptman Ham, LLP

(57) ABSTRACT

A photomask includes a pattern region and a plurality of defects in the pattern region. The photomask further includes a first fiducial mark outside of the pattern region, wherein the first fiducial mark includes identifying information for the photomask, the first fiducial mark has a first size and a first shape. The photomask further includes a second fiducial mark outside of the pattern region. The second fiducial mark has a second size different from the first size, or a second shape different from the first shape.

20 Claims, 7 Drawing Sheets

PHOTOMASK INCLUDING FIDUCIAL MARK, METHOD OF PATTERNING THE PHOTOMASK AND METHOD OF MAKING SEMICONDUCTOR DEVICE USING THE PHOTOMASK

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In order to assist with scaling down, extreme ultraviolet (EUV) photolithography processes are used to pattern wafers. During photolithographic exposure, radiation contacts a photomask before striking a photoresist coating on a wafer. The radiation transfers a pattern from the photomask onto the photoresist. The photoresist is selectively removed to reveal the pattern. The substrate then undergoes processing steps that take advantage of the shape of the remaining photoresist to create features on the substrate. When the processing steps are complete, photoresist is reapplied and the wafer is exposed using a different mask to impart a different pattern. In this way, the features are layered to produce a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
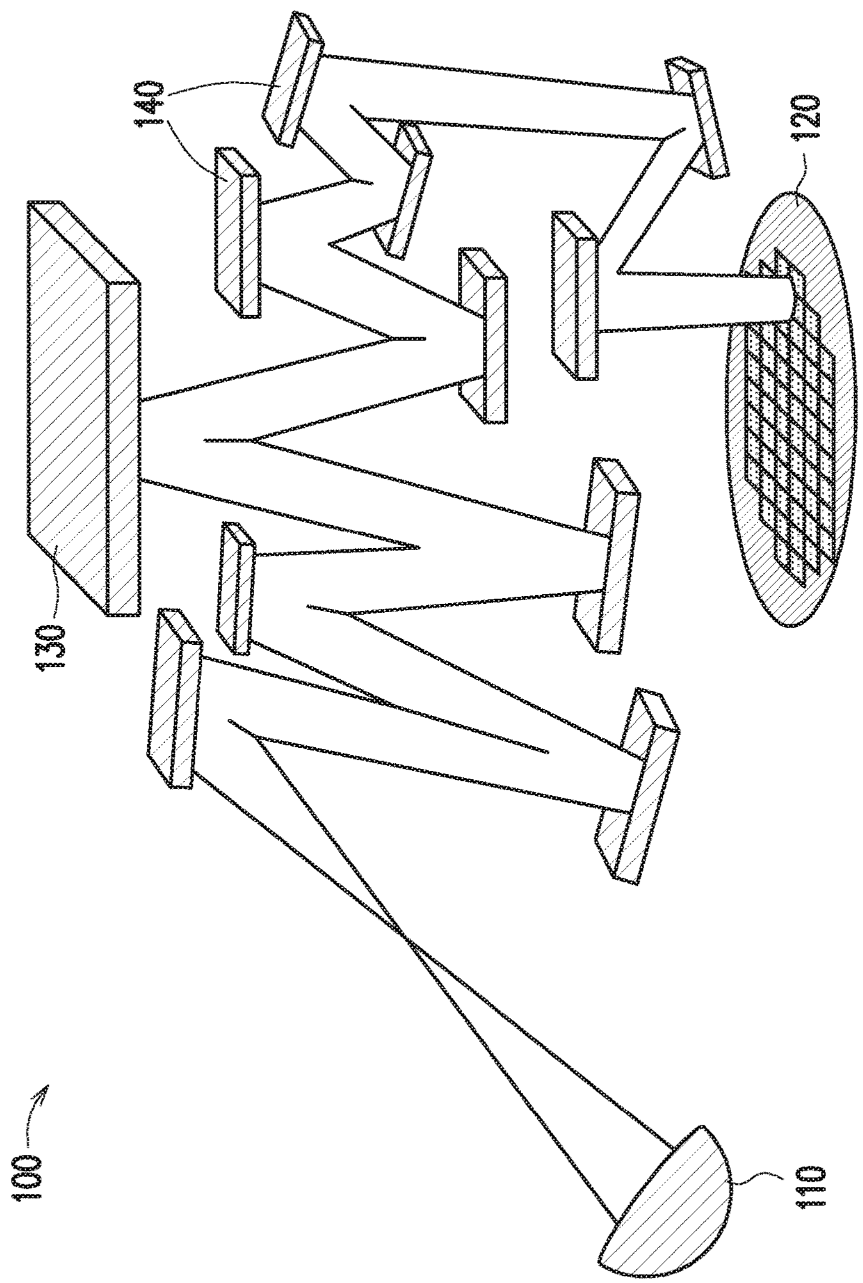
FIG. 1 is a schematic diagram of a photolithography arrangement in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described below is usable in many applications, including fin-type field effect transistors (FinFETs). For example, the fins may be patterned to produce a relatively close spacing between features, for which the present disclosure is well suited. In addition, spacers used in forming fins of FinFETs, also referred to as mandrels, are able to be processed according to the following description.

Fiducial marks are marks which are not part of a pattern to be transferred to a wafer. Fiducial marks include identification marks, alignment marks, logos, instructions, other text or other suitable information conveying patterns. In some embodiments, the fiducial mark includes a Q-code, a barcode, a trademark, operating instructions or other suitable information. Using fiducial marks helps to identify a photomask (also called a mask or a reticle). Specific information related to the photomask is able to be stored in a non-transitory computer readable medium and retrieved based on the identity of the photomask. For example, in some embodiments, the fiducial marks are able to store locations of defects within the photomask; and a process for manufacturing the photomask is adjusted based on the stored locations of defects.

Fiducial marks are also usable as alignment marks for e-beam writing tools used to pattern the photomask. E-beam writing tools use electron beams (e-beams) to selectively remove portions of the photomask in order to define the pattern to be transferred to the wafer. Using alignment marks with the e-beam writing tools helps to increase precision in formation of the pattern on the photomask. As scaling down of semiconductor devices continues, increased precision helps to increase production yield for devices having smaller critical dimensions (CDs).

Other approaches determine a location of defects within the photomask and attempt to correct the defects. However, correction of the defects is not always possible. For example, if a defect is a result of an imperfection in a substrate of the photomask, correction of the defect is extremely difficult. In some instances, correction of the defect is imperfect, such that the precision of the pattern transferred to the wafer is reduced. However, identifying the locations of the defects in the photomask and then positioning the pattern on the photomask based on the identified locations reduces or avoids overlap between the pattern and identified defects. As a result, precise transfer of the pattern to the wafer increases and production yield increases. A photolithography arrangement, such as photolithography arrangement 100 (FIG. 1), is usable to transfer the pattern on a photomask to a wafer.

FIG. 1 is a schematic diagram of a photolithography arrangement 100 in accordance with some embodiments. Photolithography arrangement 100 includes a light source 110. Light source 110 is configured to emit electromagnetic radiation for patterning a wafer 120. A photomask 130 is located along an optical path between light source 110 and wafer 120. Optical components 140 transfer the light from light source 110 to photomask 130 and then to wafer 120.

Light source 110 generates the radiation in a wavelength for patterning a photoresist on wafer 120. In some embodiments, light source 110 is an ultraviolet (UV) light source, such as an extreme UV (EUV) light source, a vacuum UV (VUV) light source or another suitable light source. In some embodiments, light source 110 is a laser, a diode or another suitable light generating element. In some embodiments, light source 110 includes a collector configured to direct electrode magnetic radiation in a common direction along the optical path. In some embodiments, light source 110 includes a collimator configured to direct all beams of electromagnetic radiation parallel to each other.

Wafer 120 includes a substrate, e.g., a semiconductor substrate, having a photoresist layer thereon. A material of the photoresist is matched to a wavelength of the electromagnetic radiation emitted by light source 110. In some embodiments, the photoresist is a positive photoresist. In some embodiments, the photoresist is a negative photoresist. In some embodiments, wafer 120 includes active components. In some embodiments, wafer 120 includes an interconnect structure.

Photomask 130 includes a pattern thereon to be transferred to wafer 120. Photomask 130 is a reflective mask configured to reflect incident light. In some embodiments, photomask 130 is a transmissive mask configured to transmit incident light. In some embodiments, an orientation of a first feature of the pattern is rotated with respect to an orientation of a second feature of the pattern. An orientation of a feature is determined by a longitudinal direction of the feature in a direction parallel to a top surface of photomask 130. In some embodiments, the pattern includes repeated sub-patterns. In some embodiments, a spacing between a first sub-pattern and a second sub-pattern is different from a spacing between a third sub-pattern and the second sub-pattern.

Optical components 140 are configured to transfer light from light source 110 to photomask 130 and from photomask 130 to wafer 120. Optical components 140 reduce a size of the pattern on photomask 130 so that a size of the pattern formed on wafer 120 is smaller than a size of the pattern on photomask 130. In some embodiments, a ratio of the size of the pattern on photomask 130 to the size of the pattern on wafer 120 is 2:1; 4:1; 5:1; or another suitable reduction ratio. Optical components 140 are reflective elements and photolithography arrangement 100 is a catoptric arrangement. In some embodiments, at least one of optical components 140 is a transmissive element, and photolithography arrangement 100 is a catadioptric arrangement.

By adjusting a location of at least a portion of the pattern on the photomask, the effect of defects on the transfer of the pattern to wafer 120 is reduced. In some embodiments, the adjusted location of the portion of the pattern causes the defect to be located outside a functional area of the pattern, for example, in an area of the pattern designated for a scribe line. In some embodiments, the adjusted location of the portion of the pattern causes the defect to be located underneath an absorption layer of photomask 130. In some embodiments, the location is adjusted by translating at least the portion of the pattern in a plane parallel to the top surface of photomask 130. In some embodiments, the location is adjusted by rotating at least the portion of the pattern about an axis perpendicular to the top surface of photomask 130.

Figure 2A:
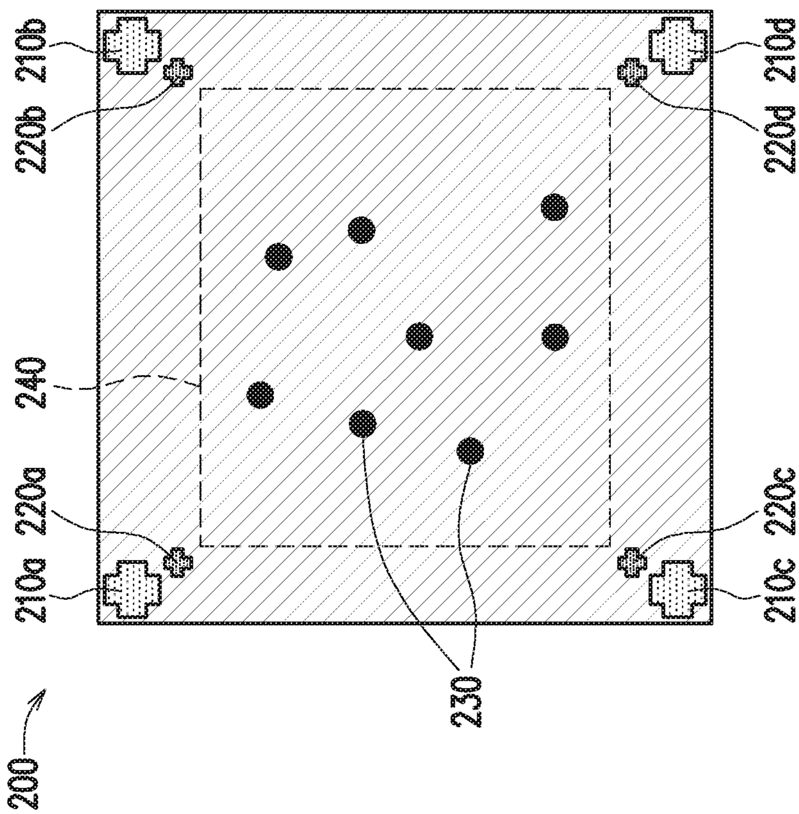
FIG. 2A is a plan view of a photomask in accordance with some embodiments.

FIG. 2A is a plan view of a photomask 200 in accordance with some embodiments. In some embodiments, photomask 200 is usable as photomask 130 in photolithography arrangement 100 (FIG. 1). Photomask 200 includes first fiducial marks 210*a*, 210*b*, 210*c* and 210*d* (collectively called first fiducial marks 210). Photomask 200 further includes second fiducial marks 220*a*, 220*b*, 220*c* and 220*d* (collectively called second fiducial marks 220). A plurality of defects 230 are present in photomask 200. First fiducial marks 210 and second fiducial marks 220 are located outside of a region 240 where a pattern for forming functional elements on a wafer are located.

Photomask 200 includes a pattern in region 240 to be transferred to the wafer using a photolithography process. Region 240 is determined based on a boundary of a pattern to be transferred to the wafer using the photolithography process. In some embodiments, the photolithography process is an EUV photolithography process. In some embodiments, photomask 200 is a reflective photomask. In some embodiments, photomask 200 is a transmissive photomask.

The pattern is defined by selectively removing portions of an absorption layer of photomask 200. Areas where the absorption layer is removed correspond to locations on the wafer which are exposed to radiation from photomask 200. Areas where the absorption layer remains correspond to locations on the wafer which are not exposed to radiation from photomask 200. In some embodiments, the pattern includes a plurality of repeated sub-patterns. In some embodiments, the pattern includes an array, e.g., a two-dimensional array, of sub-patterns and each sub-pattern includes substantially identical features. In some embodiments, a spacing between a first sub-pattern and a second sub-pattern in a first direction is different from a spacing between a third sub-pattern and the second sub-pattern in the first direction. The first direction is parallel to a top surface of photomask 200. In some embodiments, at least one sub-pattern is rotated about an axis perpendicular to the top surface of photomask 200 with respect to another sub-pattern. The variable spacing between sub-patterns and/or rotation of at least one sub-pattern is the result of defining the sub-patterns on photomask 200 in locations to avoid defects 230.

Defects 230 result from manufacturing variation during production of photomask 200 or latent defects in a substrate of photomask 200. Defects 230 affect radiation transmitted/reflected by photomask 200. For example, if a defect 230 is a hillock or bump, a direction of radiation reflected by the photomask 200 at the defect is different from a direction of radiation reflected by the photomask 200 in a defect-free area. The change in the direction of reflection causes an error in the pattern intended to be transferred to the wafer.

Defects 230 occur in different levels of photomask 200. For example, in some instances, a defect 230 is located on the top surface of photomask 200. In some instances, a defect 230 is located below the top surface of photomask 200. Defects 230 located below the top surface of photomask are difficult to fix and in some instance impossible to fix. Avoiding the effect of defects 230 by adjusting locations or orientations of sub-patterns prior to defining the sub-patterns on photomask 200 reduces or avoids errors in the pattern transferred to the wafer.

First fiducial marks 210 are used to help identify photomask 200. First fiducial marks 210 provide photomask 200 with a unique identification different from all other photomasks in the semiconductor manufacturing process. Using first fiducial marks 210, a processor is able to identify photomask 200 and retrieve data related to photomask 200.

Photomask 200 includes first fiducial marks 210 in each corner of photomask 200. In some embodiments, first fiducial marks 210 are omitted from at least one corner of photomask 200. For example, in some embodiments, first fiducial marks 210*a* and 210*d* are omitted. In some embodiments, first fiducial marks 210*b*, 210*c* and 210*d* are omitted. In some embodiments, at least one first fiducial mark 210 is positioned at a location other than a corner, such as along a side of photomask 200. In some embodiments, photomask 200 includes more than four first fiducial marks 210.

Photomask 200 includes first fiducial marks 210 all having a same shape and size. In some embodiments, at least one first fiducial mark 210 has a different shape or size from at least another first fiducial mark 210. For example, in some embodiments, first fiducial mark 210*a* has a first size and a first shape; first fiducial mark 210*b* has a second size different from the first size and the first shape; first fiducial mark 210*c* has the first size and a second shape different from the first shape; and first fiducial mark 210*d* has a third size different from the first and second sizes and a third shape different from the first and second shape. First fiducial marks 210 have a cross shape. In some embodiments, at least one first fiducial mark 210 has a rectangular shape, a triangular shape, a circular shape, a free-form shape, a bar code, a Q code, a logo, text, or other suitable shapes.

One of ordinary skill would recognize that additional modifications of first fiducial marks 210 is possible within the scope of this description. In some embodiments, photomask 200 is identifiable based on a combination of a number, location, size and shape of first fiducial marks 210. In some embodiments, photomask 200 is identifiable based on information available at any single first fiducial mark 210.

Second fiducial marks 220 are used to help an e-beam writing tool identify photomask 200 and determine locations on photomask 200 to define the pattern in region 240. That is, second fiducial marks 220 are usable as alignment marks for the e-beam writing tool. In some embodiments, second fiducial marks 220 are omitted. In some embodiments, second fiducial marks 220 are recognizable using a different wavelength from that used to recognize first fiducial marks 210. The e-beam writing tool operates at a different wavelength from that used to perform photolithography using photomask 200. Having second fiducial marks 220 recognizable using a wavelength of the e-beam writing tool, while first fiducial marks 210 are recognizable using a wavelength for performing photolithography, helps to avoid mistakes by inadvertently confusing first fiducial marks 210 with second fiducial marks 220.

Photomask 200 includes second fiducial marks 220 in each corner of photomask 200. In some embodiments, second fiducial marks 220 are omitted from at least one corner of photomask 200. For example, in some embodiments, second fiducial marks 220*a* and 220*d* are omitted. In some embodiments, second fiducial marks 220*b*, 220*c* and 220*d* are omitted. In some embodiments, at least one second fiducial mark 220 is positioned at a location other than a corner, such as along a side of photomask 200. In some embodiments, photomask 200 includes more than four second fiducial marks 220.

Photomask 200 includes second fiducial marks 220 all have a same shape and size. In some embodiments, at least one second fiducial mark 220 has a different shape or size from at least one other second fiducial mark 220. For example, in some embodiments, second fiducial mark 220*a* has a first size and a first shape; second fiducial mark 220*b* has a second size different from the first size and the first shape; second fiducial mark 220*c* has the first size and a second shape different from the first shape; and second fiducial mark 220*d* has a third size different from the first and second sizes and a third shape different from the first and second shape. Second fiducial marks 220 have a cross shape. In some embodiments, at least one second fiducial mark 220 has a rectangular shape, a triangular shape, a circular shape, a free-form shape, a bar code, a Q code, a logo, text, or other suitable shapes.

Photomask 200 includes second fiducial marks 220 having a smaller size than first fiducial marks 210. In some embodiments, at least one second fiducial mark 220 has a same or greater size than at least one first fiducial mark 210. Photomask 200 includes second fiducial marks 220 have a same shape as first fiducial marks 210. In some embodiments, at least one second fiducial mark 220 has a different shape from at least one first fiducial mark 210. One of ordinary skill would recognize that additional modifications of second fiducial marks 220 is possible within the scope of this description.

Figure 2B:
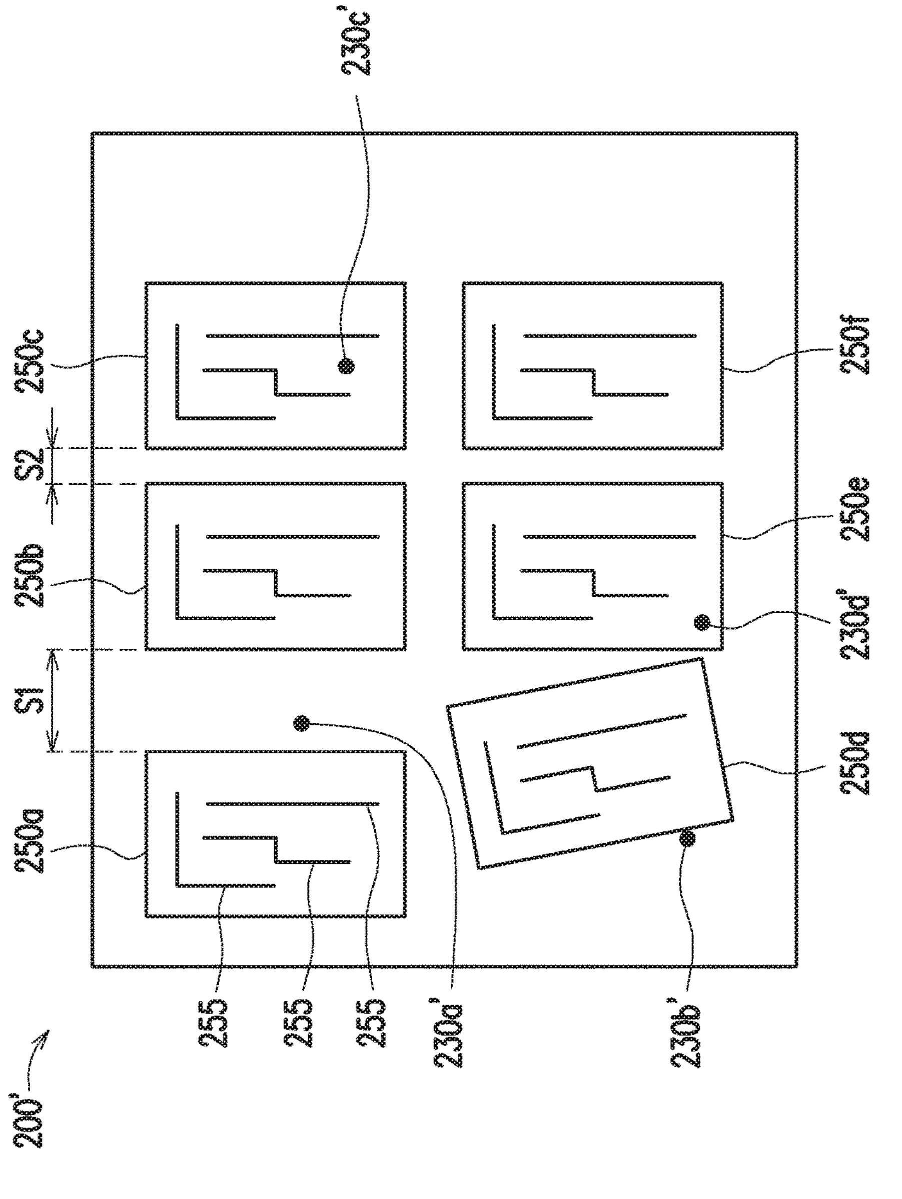
FIG. 2B is a plan view of a photomask in accordance with some embodiments.

FIG. 2B is a plan view of a photomask 200' in accordance with some embodiments. Photomask 200' is similar to photomask 200 (FIG. 2A). First fiducial marks and second fiducial marks are not shown in photomask 200' for clarity; however, the above description related to first fiducial marks and second fiducial marks is applicable to photomask 200'. Photomask 200' includes defects 230'*a*-230'*d* (collective called defects 230') at different locations from defects 230 in photomask 200. Photomask 200' also includes sub-patterns 250*a*-250*f* (collectively call sub-patterns 250). Sub-patterns 250 are arranged in a two dimensional array. Each sub-pattern 250 includes a plurality of features 255. Features 255 are portions of photomask 200' where the absorption layer is removed. Features 255 correspond to portions of the wafer which are to be contacted by radiation from photomask 200'. For simplicity, portions of sub-patterns 250 other than features 255 are considered to include the absorption layer for the purpose of this discussion.

Sub-pattern 250*a* is separated from sub-pattern 250*b* by a spacing S1. Sub-pattern 250*b* is separated from sub-pattern 250*c* by a spacing S2. Spacing S1 is greater than spacing S2. By moving sub-pattern 250*a*, the location of sub-pattern 250*a* is adjusted to avoid a defect 230*a'*. Avoiding defect 230*a'* helps to ensure precise transfer of sub-pattern 250*a* to the wafer. In comparison with approaches that include an equal spacing between all sub-patterns, photomask 200' is able to increase production yield by adjusting the location of sub-pattern 250*a* to avoid defect 230*a'*.

Sub-pattern 250*d* is rotated about an axis perpendicular to the top surface of photomask 200' with respect to sub-pattern 250*e*. By rotating sub-pattern 250*d*, the location of sub-pattern 250*d* is adjusted to avoid defect 230*b'*. Avoiding defect 230*b'* helps to ensure precise transfer of sub-pattern 250*d* to the wafer. In comparison with approaches that include all sub-patterns having a same orientation, photomask 200' is able to increase production yield by rotating sub-pattern 250*d* to avoid defect 230*b'*.

Defect 230*c*' is located within sub-pattern 250*c*. However, defect 230*c*' is located in a portion of sub-pattern 250*c* which is covered by the absorption layer. In some embodiments, a location of a sub-pattern is not adjusted in order to avoid a defect which would be covered by the absorption layer. Avoiding adjusting the locations of sub-patterns helps to increase a number of sub-patterns definable on photomask 200'; and reduces a complexity of manufacturing photomask 200'.

Defect 230*d*' is located at a periphery of sub-pattern 250*e*. In some instances, a periphery of a sub-pattern does not include features 255 which are used to define functional elements on the wafer. For example, a scribe line on the wafer may be defined at a location corresponding to a periphery of sub-pattern 250*e*. In some embodiments, a location of a sub-pattern is not adjusted in order to avoid a defect which would be located in a portion of the sub-pattern which does not include features 255 corresponding to functional elements on the wafer. Avoiding adjusting the locations of sub-patterns helps to increase a number of sub-patterns definable on photomask 200', and reduces a complexity of manufacturing photomask 200'.

Figure 3:
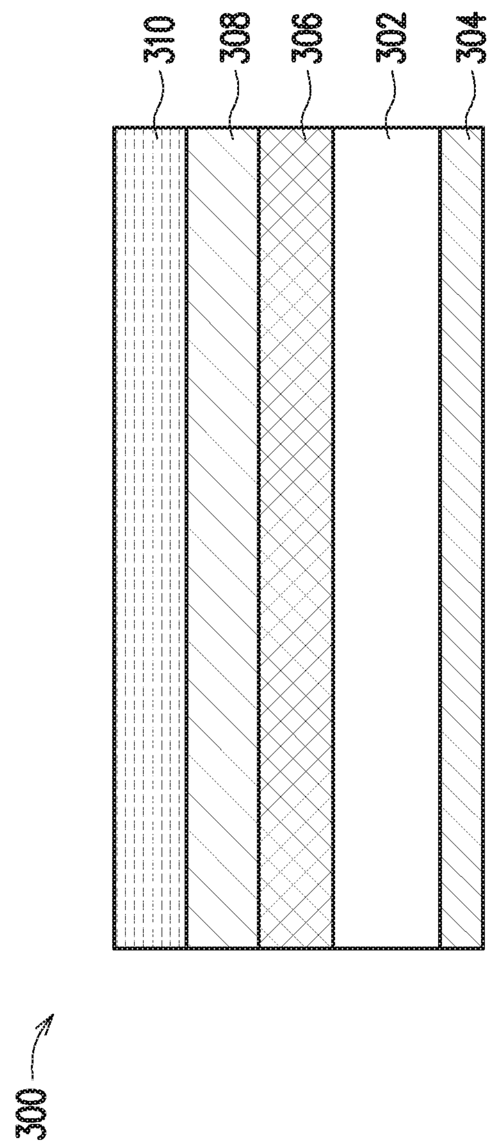
FIG. 3 is a cross-sectional view of a photomask blank in accordance with some embodiments.

FIG. 3 is a cross-sectional view of a photomask blank 300 in accordance with some embodiments. In some embodiments, photomask blank 300 is usable to form photomask 130 (FIG. 1), photomask 200 (FIG. 2A) or photomask 200' (FIG. 2B). Photomask blank 300 includes a substrate 302 on a carrier layer 304. A reflective layer 306 is on a surface of substrate 302 opposite carrier layer 304. A buffer layer 308 over reflective layer 306 helps to protect the reflective layer during later processing of photomask blank 300. An absorption layer 310 is over buffer layer 308. Selectively removing portions of absorption layer 310 defines a pattern on photomask blank 300 to be transferred to a wafer.

In some embodiments, substrate 302 includes a low thermal expansion material (LTEM). Exemplary low thermal expansion materials include quartz as well as LTEM glass, silicon, silicon carbide, silicon oxide, titanium oxide, Black Diamond® or other suitable low thermal expansion substances.

To support the substrate 302, a carrier layer 304 is attached to substrate 302. In some embodiments, carrier layer 304 materials include chromium nitride, chromium oxynitride, chromium, TaBN, TaSi or other suitable materials.

In some embodiments, reflective layer 306 includes a multilayer mirror (MLM). An MLM includes alternating material layers. In some embodiments, the number of pairs of alternating material layers ranges from 20 to 80. A material used for each layer of the alternating material layers are selected based on a refractive index to a wavelength of radiation to be received by the photomask. The layers are then deposited to provide the desired reflectivity for a particular wavelength and/or angle of incidence of the received radiation. For example, a thickness or material of layers within the MLM is tailored to exhibit maximum constructive interference of EUV radiation reflected at each interface of the alternating material layers while exhibiting a minimum absorption of EUV radiation. In some embodiments, the MLM includes alternating molybdenum and silicon (Mo—Si) layers. In some embodiments, the MLM includes alternating molybdenum and beryllium (Mo—Be) layers.

Buffer layer 308 is over reflective layer 306 to help protect the reflective layer during removal processes performed on absorption layer 310. In some embodiments, buffer layer 308 includes materials such as Ru, silicon dioxide, amorphous carbon or other suitable materials.

In some embodiments, absorption layer 310 includes TaN, TaBN, TiN, chromium, combinations thereof, or other suitable absorptive materials. In some embodiments, absorption layer 310 contains multiple layers of absorptive material, for example a layer of chromium and a layer of tantalum nitride. Absorption layer 310 has a thickness sufficient to prevent penetration of incident radiation to reflective layer 306 and subsequent reflected light from exiting absorption layer 310. In some embodiments, absorption layer 310 includes an anti-reflective coating (ARC). Suitable ARC materials include TaBO, $Cr_2O_3$, $SiO_2$, SiN, $TaO_5$, TaON, or other suitable ARC materials. Selectively removing portions of absorption layer 310 defines features, e.g., features 255 (FIG. 2B), corresponding to functional elements on the wafer.

Reflective layer 306, buffer layer 308 and absorption layer 310 are formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, or other suitable methods.

In some embodiments, fiducial marks, e.g., first fiducial marks 210 or second fiducial marks 220 (FIG. 2A), are formed by selectively removing a portion of absorption layer 310. In some embodiments, fiducial marks are formed by selectively removing a portion of absorption layer 310 and buffer layer 308. In some embodiments, fiducial marks are formed by selectively removing a portion of absorption layer 310, buffer layer 308 and reflective layer 306. In some embodiments, different types of fiducial marks are formed by removing portions of photomask 300 to different depths. For example, in some embodiments, first fiducial marks, e.g., first fiducial marks 210, are formed by removing a portion of photomask 300 to expose buffer layer 308; and second fiducial marks, e.g., second fiducial marks 220, are formed by removing a portion of photomask 300 to expose substrate 302.

Figure 4:
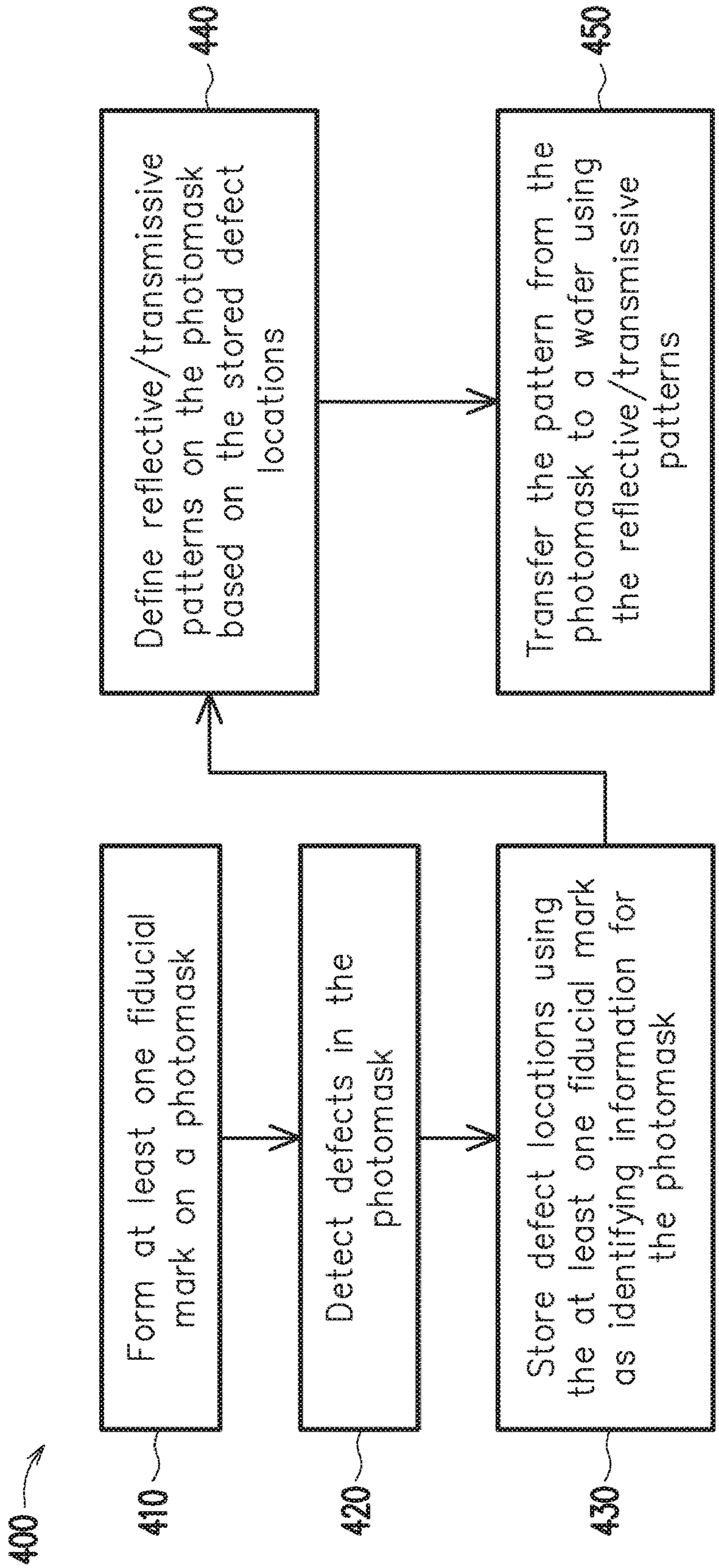
FIG. 4 is a flow chart of a method of making a semiconductor device using a photomask in accordance with some embodiments.

FIG. 4 is a flow chart of a method 400 of making a semiconductor device using a photomask in accordance with some embodiments. The description below relates method 400 to elements of FIGS. 2A, 2B, 3 and 5 above for the sake of clarity; however, the current application should not be limited to the embodiments of FIGS. 2A, 2B, 3 and 5 because one of ordinary skill in the art would understand how to modify method 400 for use with other photomasks.

In operation 410, at least one fiducial mark 210 and/or 220 (FIG. 2A) is formed on a photomask. The at least one fiducial mark 210 and/or 220 includes a fiducial mark 210 used for identifying the photomask. In some embodiments, the at least one fiducial mark 210 and/or 220 includes a plurality of fiducial marks 210 for identifying the photomask. In some embodiments, the at least one fiducial mark 210 and/or 220 includes a fiducial mark 210 for identifying the photomask and a fiducial mark 220 for aligning an e-beam writing tool to define a pattern on the photomask. In some embodiments, the at least one fiducial mark 210 and/or 220 includes a plurality of fiducial marks 210 for identifying the photomask and a plurality of fiducial marks 220 for aligning an e-beam writing tool to define a pattern on the photomask.

In some embodiments, the at least one fiducial mark is formed by selectively removing a portion of an absorption layer 310 (FIG. 3). In some embodiments, a depth of a first fiducial mark of the at least one fiducial mark 210 and/or 220 is different form a depth of a second fiducial mark of the at least one fiducial mark 210 and/or 220. In some embodiments, the removal process includes etching, laser drilling, e-beam writing, ion beam writing, or another suitable material removal process.

In operation 420, defects in the photomask are detected. The defects 230*a*'-230*d*' in the photomask are detected using an inspection system. The inspection system illuminates the photomask with radiation in order to identify areas of variation in reflection of the radiation by the photomask. The variation in reflection indicates a variation in topography, density, crystal structure or other types of defects. In some embodiments, the inspection system illuminates the photomask with a plurality of wavelengths in order to detect defects in the photomask. In some embodiments, the wavelength of the inspection system matches a wavelength of a photolithography process to be performed using the photomask. In some embodiments, the wavelength of the inspection system is EUV, deep ultraviolet (DUV), vacuum ultraviolet (VUV) or another suitable wavelength.

Figure 5:
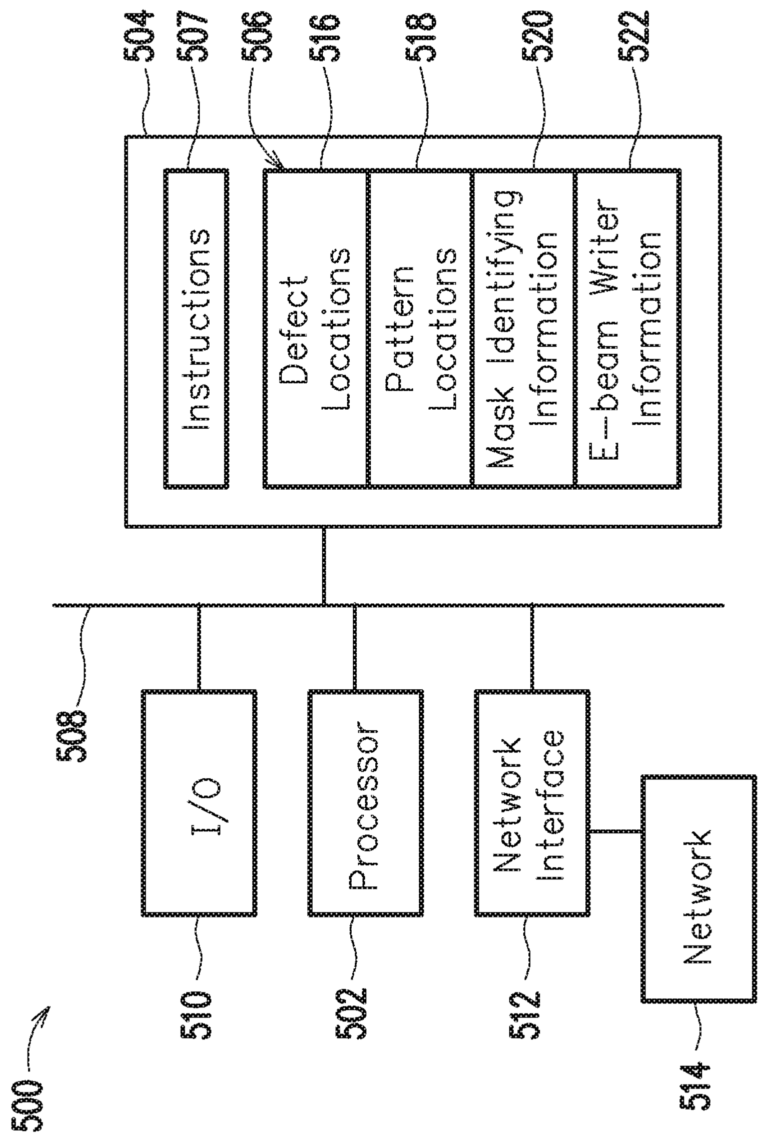
FIG. 5 is a schematic diagram of a system for making a semiconductor device in accordance with some embodiments.

In operation 430, the locations of the detected defects are stored, e.g., in non-transitory computer readable medium 504 (FIG. 5). The stored location information is correlated to identifying information of the photomask. The identifying information is based on the at least one fiducial mark 210 and/or 220. The location information is stored on a non-transitory computer readable medium 504 for retrieval during a patterning process of the photomask. In some embodiments, the location information is stored in a table. In some embodiments, the location information is stored in a non-transitory computer readable medium in the inspection system. In some embodiments, the location information is transmitted, either wired or wireless, to a non-transitory computer readable medium separate from the inspection system.

In operation 440, reflective or transmissive patterns 250*a*-250*f* (FIG. 2B) are defined on the photomask based on the stored defect locations. The patterns 250*a*-250*f* are defined on the photomask using an e-beam writing tool. In some embodiments, the e-beam writing tool uses at least one fiducial mark 220 on the photomask as an alignment mark for defining the patterns on the photomask.

Initial locations for the patterns 250*a*-250*f* are based on a hypothetical defect-free photomask. A processor, e.g., process 502 (FIG. 5) connected to the e-beam writing tool is configured to provide instructions to the e-beam writing tool to adjust a location of at least one of the patterns 250*a*-250*f* based on the stored defect locations. The location is adjusted by rotating the pattern, e.g., pattern, 250*d*, or by translating the pattern, e.g., pattern 250*a*, in a plane parallel to the top surface of the photomask.

The processor 502 is configured to retrieve the defect locations from a non-transitory computer readable medium 504 based on identifying information of the photomask. The identifying information is obtained based on the at least one fiducial mark 210 on the photomask. In some embodiments, an optical scanner reads the at least one fiducial mark 210. The optical scanner is connected to the processor 502; and the processor 502 is configured to compare the at least one fiducial mark 210 with other fiducial marks in order to identify the photomask.

In some embodiments, the processor 502 automatically provides instructions to the e-beam writing tool for adjusting the location of at least one of the patterns 250*a*-250*f*. In some embodiments, the processor 502 receives instructions from a user, e.g., through I/O interface 510 (FIG. 5), for adjusting the location of at least one of the patterns 250*a*-250*f*. In some embodiments, the processor 502 provides suggested locations adjustments to the user.

In operation 450, the pattern from the photomask is transferred to a wafer using the reflective or transmissive patterns. The pattern is transferred using a photolithography process, e.g., an EUV photolithography process. In some embodiments, the pattern is transferred to the wafer by sequentially scanning sub-patterns 250*a*-250*f* on the photomask. In some embodiments, a processor is connected to the photolithography tool in order to provide instructions for locations of each of the patterns on the photomask. The instructions provided by the processor 502 help the photolithography tool, e.g., photolithography arrangement 100 (FIG. 1), account for adjustments in locations of patterns from operation 440. In some embodiments, the processor 502 is configured to provide instructions to the photolithography tool based on identifying information from the at least one fiducial mark 210 and/or 220 on the photomask.

In some embodiments, an order of operations of method 400 is altered. For example, in some embodiments, operation 420 occurs prior to operation 410. In some embodiments, at least one operation is omitted from method 400. For example, in some embodiments, a manufacturer receives a photomask along with a defect map and operation 420 is omitted. In some embodiments, additional operations are added to method 400. For example, in some embodiments, fiducial marks of different types are formed using different processes or at different times.

FIG. 5 is a schematic diagram of a system 500 for making a semiconductor device in accordance with some embodiments. System 500 includes a hardware processor 502 and a non-transitory, computer readable storage medium 504 encoded with, i.e., storing, the computer program code 506, i.e., a set of executable instructions. Computer readable storage medium 504 is also encoded with instructions 507 for interfacing with manufacturing machines for producing the semiconductor device. The processor 502 is electrically coupled to the computer readable storage medium 504 via a bus 508. The processor 502 is also electrically coupled to an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program code 506 encoded in the computer readable storage medium 504 in order to cause system 500 to be usable for performing a portion or all of the operations as described in method 400.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 504 stores the computer program code 506 configured to cause system 500 to perform method 400. In some embodiments, the storage medium 504 also stores information needed for performing 400 as well as information generated during performing the method 400, such as a defect locations parameter 516, a pattern locations parameter 518, mask identifying information parameter 520, an e-beam writer information parameter 522 and/or a set of executable instructions to perform the operation of method 400.

In some embodiments, the storage medium 504 stores instructions 507 for interfacing with manufacturing machines. The instructions 507 enable processor 502 to generate manufacturing instructions readable by the manufacturing machines to effectively implement method 400 during a manufacturing process.

System 500 includes I/O interface 510. I/O interface 510 is coupled to external circuitry. In some embodiments, I/O interface 510 includes a keyboard, keypad, mouse, trackball, trackpad, and/or cursor direction keys for communicating information and commands to processor 502.

System 500 also includes network interface 512 coupled to the processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interface such as ETHERNET, USB, or IEEE-1394. In some embodiments, method 400 is implemented in two or more systems 500, and information such as memory type, memory array layout, I/O voltage, I/O pin location and charge pump are exchanged between different systems 500 via network 514.

System 500 is configured to receive information related to defect locations through I/O interface 510 or network interface 512. The information is transferred to processor 502 via bus 508 to determine locations of the defects. The locations of the defects are then stored in computer readable medium 504 as defect locations parameter 516. System 500 is configured to generate information related to pattern locations. The information is stored in computer readable medium 504 as pattern locations parameter 518. System 500 is configured to receive information related to mask identifying information through I/O interface 510 or network interface 512. The information is stored in computer readable medium 504 as mask identifying information parameter 520. System 500 is configured to receive information related to e-beam writing information through I/O interface 510 or network interface 512. The information is stored in computer readable medium 504 as e-beam writer information parameter 522.

During operation, processor 502 executes a set of instructions 507 to identify a photomask; retrieve locations of defects of the identified photomask; and provide instructions to an e-beam writing tool for determining a location of patterns to be defined on the photomask. By executing instructions 507, and storing and retrieving information from computer readable medium 504, processor 502 is able to execute method 400.

Figure 6:
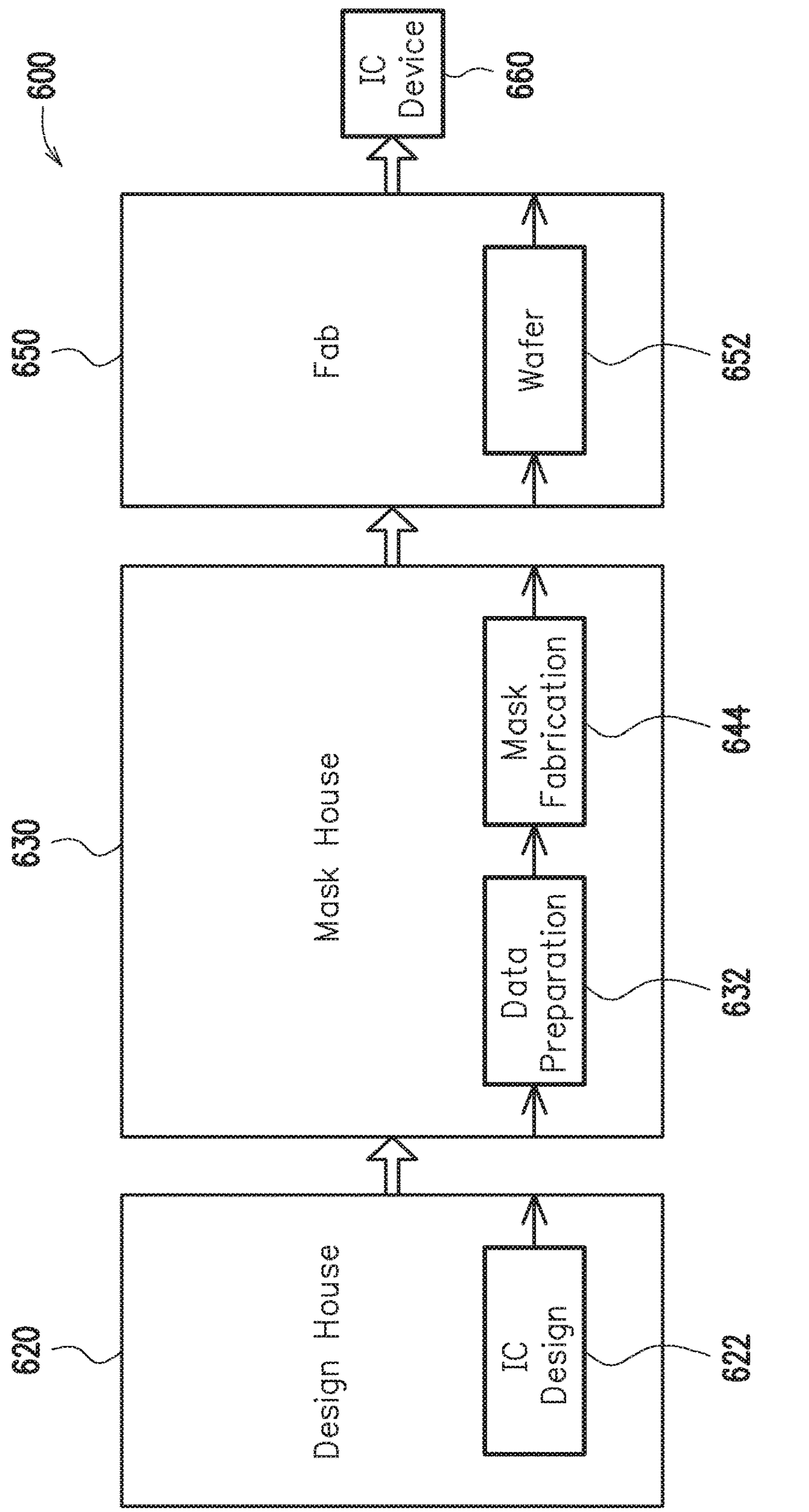
FIG. 6 is a block diagram of an integrated circuit (IC) manufacturing system, and an IC manufacturing flow associated therewith, in accordance with some embodiments.

FIG. 6 is a block diagram of an integrated circuit (IC) manufacturing system 600, and an IC manufacturing flow associated therewith, in accordance with some embodiments.

In general, system 600 generates a layout. Based on the layout, system 600 fabricates at least one of (A) one or more semiconductor masks or (b) at least one component in a layer of an inchoate semiconductor integrated circuit.

In FIG. 6, IC manufacturing system 600 includes entities, such as a design house 620, a mask house 630, and an IC manufacturer/fabricator ("fab") 650, that interact with one another in the design, development, and manufacturing cycles and/or services related to manufacturing an IC device 660. In some embodiments, the manufacturing system 600 is usable to create a photomask, e.g., photomask 200 (FIG. 2A) or photomask 200' (FIG. 2B), based on a layout design and then transfer a pattern on the photomask to a wafer, e.g., using photolithography arrangement 100 (FIG. 1). The entities in system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 620, mask house 630, and IC fab 650 is owned by a single larger company. In some embodiments, two or more of design house 620, mask house 630, and IC fab 650 coexist in a common facility and use common resources.

Design house (or design team) 620 generates an IC design 622 in the form of a layout. IC design 622 is usable to determine a pattern to be formed on a photomask, e.g., photomask 200 (FIG. 2A) or photomask 200' (FIG. 2B). IC design 622 includes various geometrical patterns designed for an IC device 660. The geometrical patterns correspond to patterns of metal, oxide, or semiconductor layers that make up the various components of IC device 660 to be fabricated. The various layers combine to form various IC features. For example, a portion of IC design 622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 620 implements a proper design procedure to form IC design 622. The design procedure includes one or more of logic design, physical design or place and route. IC design 622 is presented in one or more data files having information of the geometrical patterns. For example, IC design 622 can be expressed in a GDSII file format or DFII file format.

Mask house 630 includes data preparation 632 and mask fabrication 644. Mask house 630 uses IC design 622 to manufacture one or more masks, e.g., photomask 200 (FIG. 2A) or photomask 200' (FIG. 2B), to be used for fabricating the various layers of IC device 660 according to IC design 622. Mask house 630 performs mask data preparation 632, where IC design 622 is converted into a representative data file ("RDF"). Mask data preparation 632 provides the RDF to mask fabrication 644. In some embodiments, mask fabrication 644 modifies a photomask blank, e.g., photomask blank 300 (FIG. 3), to form a photomask, e.g., photomask 200 (FIG. 2A) or photomask 200' (FIG. 2B), which includes at least one pattern, e.g., sub-patterns 250*a*-250*f* (FIG. 2B). Mask fabrication 644 includes a mask writer. A mask writer converts the RDF to an image on a substrate, such as a mask (reticle) or a semiconductor wafer. The design layout is manipulated by mask data preparation 632 to comply with particular characteristics of the mask writer and/or requirements of IC fab 650. In FIG. 6, mask data preparation 632 and mask fabrication 644 are illustrated as separate elements. In some embodiments, mask data preparation 632 and mask fabrication 644 can be collectively referred to as mask data preparation. In some embodiments, method 400 (FIG. 4) is implemented by mask house 630. In some embodiments, mask house 630 outputs a mask, e.g., photomask 200 (FIG. 2A) or photomask 200' (FIG. 2B).

In some embodiments, mask data preparation 632 includes optical proximity correction (OPC) which uses lithography enhancement techniques to compensate for image errors, such as those that can arise from diffraction, interference, other process effects or the like. OPC adjusts IC design 622. In some embodiments, mask data preparation 632 includes further resolution enhancement techniques (RET), such as off-axis illumination, sub-resolution assist features, phase-shifting masks, other suitable techniques, or the like or combinations thereof. In some embodiments, inverse lithography technology (ILT) is also used, which treats OPC as an inverse imaging problem.

In some embodiments, mask data preparation 632 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, or the like. In some embodiments, the MRC modifies the IC design layout to compensate for limitations during mask fabrication 644, which may undo part of the modifications performed by OPC in order to meet mask creation rules.

In some embodiments, mask data preparation 632 includes lithography process checking (LPC) that simulates processing that will be implemented by IC fab 650 to fabricate IC device 660. LPC simulates this processing based on IC design 622 to create a simulated manufactured device, such as IC device 660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, or the like or combinations thereof. In some embodiments, after a simulated manufactured device has been created by LPC, if the simulated device is not close enough in shape to satisfy design rules, OPC and/or MRC are be repeated to further refine IC design 622.

It should be understood that the above description of mask data preparation 632 has been simplified for the purposes of clarity. In some embodiments, data preparation 632 includes additional features such as a logic operation (LOP) to modify the IC design layout according to manufacturing rules. Additionally, the processes applied to IC design 622 during data preparation 632 may be executed in a variety of different orders.

After mask data preparation 632 and during mask fabrication 644, a mask, e.g., photomask 200 (FIG. 2A) or photomask 200' (FIG. 2B), or a group of masks are fabricated, e.g., using photomask blank 300 (FIG. 3), based on the modified IC design 622. In some embodiments, an electron-beam (e-beam) or a mechanism of multiple e-beams is used to form a pattern on a mask (photomask or reticle) based on the modified IC design 622. In some embodiments, the e-beam using at least one fiducial mark, e.g., fiducial marks 220, to determine a location to form a pattern on the mask. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 644 is used in a variety of processes. For example, such a mask(s) is used in an ion implantation process to form various doped regions in the semiconductor wafer, in an etching process to form various etching regions in the semiconductor wafer, and/or in other suitable processes.

IC fab 650 is an IC fabrication business that includes one or more manufacturing facilities for the fabrication of a variety of different IC products. In some embodiments, IC Fab 650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 650 uses, e.g., in photolithography arrangement 100 (FIG. 1), the mask (or masks) fabricated by mask house 630, e.g., photomask 200 (FIG. 2A) or photomask 200' (FIG. 2B), to fabricate IC device 660. Thus, IC fab 650 at least indirectly uses IC design 622 to fabricate IC device 660. In some embodiments, a semiconductor wafer 652 is fabricated by IC fab 650 using the mask (or masks) to form IC device 660. Semiconductor wafer 652 includes a silicon substrate or other proper substrate having material layers formed thereon. Semiconductor wafer further includes one or more of various doped regions, dielectric features, multilevel interconnects, or the like (formed at subsequent manufacturing steps).

Details regarding an integrated circuit (IC) manufacturing system (e.g., system 600 of FIG. 6), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to a photomask. The photomask includes a pattern region and a plurality of defects in the pattern region. The photomask further includes a first fiducial mark outside of the pattern region, wherein the first fiducial mark includes identifying information for the photomask, the first fiducial mark has a first size and a first shape. The photomask further includes a second fiducial mark outside of the pattern region. The second fiducial mark has a second size different from the first size, or a second shape different from the first shape.

Another aspect of this description relates to a method of patterning a photomask. The method includes forming at least one fiducial mark on the photomask, wherein the at least one fiducial mark is outside of a pattern region of the photomask, and the at least one fiducial mark includes identifying information for the photomask. The method further includes defining a plurality of patterns on the photomask in the pattern region based on the identifying information. Defining of the plurality of patterns includes determining locations of defects in the photomask based on the identifying information. Defining the plurality of patterns further includes adjusting a location of at least one pattern of the plurality of patterns based on the locations of defects. Defining the plurality of patterns further includes selectively removing a portion of an absorption layer based on the adjusted location of the at least one pattern.

Still another aspect of this description relates to a method of making a semiconductor device. The method includes forming at least one fiducial mark on a photomask, wherein the at least one fiducial mark is outside of a pattern region of the photomask, and the at least one fiducial mark includes identifying information for the photomask. The method further includes defining a pattern including a plurality of sub-patterns on the photomask in the pattern region based on the identifying information. Defining of the pattern includes a) defining a first sub-pattern of the plurality of sub-patterns having a first spacing from a second sub-pattern of the plurality of sub-patterns, wherein the first spacing is different from a second spacing between the second sub-pattern and a third sub-pattern of the plurality of sub-patterns, orb) rotating the first sub-pattern about an axis perpendicular to a top surface of the photomask relative to the second sub-pattern. The method further includes transferring the pattern from the photomask to a wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of patterning a photomask, the method comprising:

forming at least one fiducial mark on the photomask, wherein the at least one fiducial mark is outside of a pattern region of the photomask, and the at least one fiducial mark includes identifying information for the photomask; and defining a plurality of patterns on the photomask in the pattern region based on the identifying information, wherein the defining of the plurality of patterns comprises:

determining locations of defects in the photomask based on the identifying information, adjusting a location of at least one pattern of the plurality of patterns based on the locations of defects, and selectively removing a portion of an absorption layer based on the adjusted location of the at least one pattern.

2. The method of claim 1, further comprising:

detecting the locations of the defects; and storing the locations of the defects in a non-transitory computer readable medium.

3. The method of claim 2, wherein the storing of the locations of the defects comprises storing the locations of the defects in relation to the identifying information.

4. The method of claim 1, wherein the selectively removing of the portion of the absorption layer comprises using an e-beam writing tool to selectively remove the portion of the absorption layer.

5. The method of claim 1, further comprising using a fiducial mark of the at least one fiducial mark as an alignment mark for the selectively removing of the portion of the absorption layer.

6. The method of claim 1, wherein the determining of the locations of the defects comprises:

obtaining the identifying information from the at least one fiducial mark, and retrieving the locations of the defects from a non-transitory computer readable medium using the obtained identifying information.

7. The method of claim 1, wherein the adjusting the location of the at least one pattern comprises translating the at least one pattern in a plane parallel to a top surface of the photomask.

8. The method of claim 1, wherein the adjusting of the location of the at least one pattern comprises rotating the at least one pattern about an axis perpendicular to a top surface of the photomask.

9. A method of patterning a photomask, the method comprising:

forming a first fiducial mark on the photomask, wherein the first fiducial mark is outside of a pattern region of the photomask, and the first fiducial mark includes defect location information for the photomask; and defining a plurality of patterns on the photomask in the pattern region, wherein the defining of the plurality of patterns comprises:

determining whether a defect is located within a first pattern of the plurality of patterns based on the defect location information, determining whether the defect is located within a region of the first pattern covered by an absorption layer, adjusting a location of the first pattern in response to the defect being located within the first pattern and the defect being located outside the region of the first pattern covered by the absorption layer, and maintaining the location of the first pattern in response to the defect being located outside of the first pattern or the defect being located within the region of the first pattern covered by the absorption layer.

10. The method of claim 9, further comprising selectively removing a portion of an absorption layer in response to adjusting the location of the first pattern.

11. The method of claim 9, wherein the adjusting the location of the first pattern comprises rotating the first pattern.

12. The method of claim 9, wherein the adjusting the location of the first pattern comprises translating the first pattern in a plane parallel to a top surface of the photomask.

13. The method of claim 9, wherein the adjusting the location of the first pattern comprises changing a first spacing between the first pattern and a second pattern of the plurality of patterns to be different from a second spacing between the second pattern and a third pattern of the plurality of patterns.

14. The method of claim 9, further comprising forming a second fiducial mark on the photomask, wherein the first fiducial mark is different from the second fiducial mark.

15. The method of claim 14, wherein the forming the second fiducial mark comprises forming the second fiducial mark closer to the plurality of patterns than the first fiducial mark.

16. A method of patterning a photomask, the method comprising:

forming a first fiducial mark on the photomask, wherein the first fiducial mark includes identifying information for the photomask;

determining a location of a first defect in the photomask based on the identifying information; and defining a plurality of patterns on the photomask based on the identifying information, wherein the defining of the plurality of patterns comprises:

determining whether the first defect is located within a first pattern of the plurality of patterns based on the location of the first defect, determining whether the defect is located within a region of the first pattern covered by an absorption layer, and adjusting a location of the first pattern in response to the defect being located within the first pattern and the defect being located outside the region of the first pattern covered by the absorption layer.

17. The method of claim 16, further comprising maintaining the location of the first pattern in response to the defect being located outside of the first pattern or the defect being located within the region of the first pattern covered by the absorption layer.

18. The method of claim 16, further comprising selectively removing a portion of an absorption layer in response to adjusting the location of the first pattern.

19. The method of claim 16, wherein the adjusting the location of the first pattern comprises rotating the first pattern or translating the first pattern in a plane parallel to a top surface of the photomask.

20. The method of claim 16, further comprising:

detecting a location of the first defect in the photomask; and storing the location of the first defect in a memory, wherein the storing the location of the first defect comprises associating the location of the first defect with the first fiducial mark.

* * * * *